United States Patent [19]

Bender et al.

[11] 4,209,742

[45] Jun. 24, 1980

[54] MODULAR PROBE SYSTEM

[75] Inventors: Herman G. Bender, Portland; James E. Dikeman, Beaverton, both of Oreg.

[73] Assignee: Tektronix, Inc., Beaverton, Oreg.

[21] Appl. No.: 731,873

[22] Filed: Oct. 13, 1976

[51] Int. Cl.² .................................. G01R 31/02
[52] U.S. Cl. .................. 324/72.5; 339/91 P; 324/51
[58] Field of Search .............. 324/72.5, 149, 158.5 P, 324/73 R, 73 PC; 339/91 R, 91 P, 29 R, 108 TP, 153, 154 A, 166 R

[56] References Cited

U.S. PATENT DOCUMENTS

| 2,849,681 | 8/1958 | Belart | 324/72.5 |
|---|---|---|---|
| 2,877,437 | 3/1959 | Flanagan, Jr. | 339/91 |
| 2,960,654 | 11/1960 | Nelson | 324/51 |
| 3,201,746 | 8/1965 | Askew | 324/72.5 |
| 3,745,514 | 7/1973 | Brishka | 339/91 R |
| 3,747,047 | 7/1973 | Carter et al. | 339/91 R X |
| 3,757,218 | 9/1973 | Oliverio et al. | 324/72.5 X |
| 4,017,139 | 4/1977 | Nelson | 339/91 R |

FOREIGN PATENT DOCUMENTS 1170489  9/1958  France .................... 324/72.5

OTHER PUBLICATIONS

Bayley, C., Combined Test Prod. & Clip. Wireless World, Feb. 1958, pp. 75-77.
Beelitz et al., Probe Socket, RCA Tech. Notes, Jan. 1968, RCATN No. 738, 2 pages.

Primary Examiner—Michael J. Tokar
Attorney, Agent, or Firm—John D. Winkelman

[57] ABSTRACT

A modular form of construction for electrical probes featuring releasably interconnected, standardized modules that can be individually replaced in the field. Included are a modular probe head, a probe cable, and both releasably locking and non-locking output terminations, including a panel mounting termination for inclusion in an electrical instrument.

7 Claims, 7 Drawing Figures

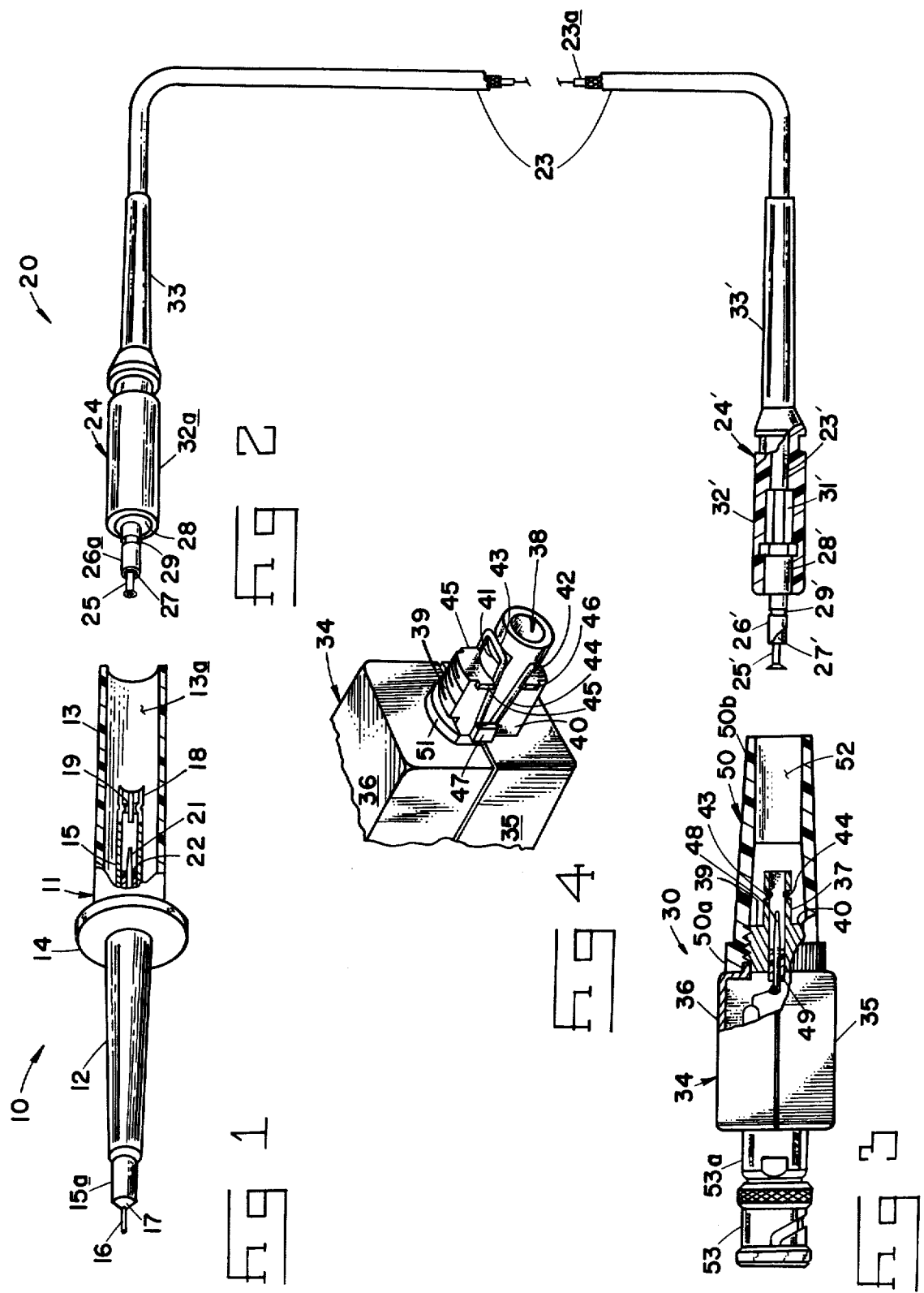

MODULAR PROBE SYSTEM

BACKGROUND OF THE INVENTION

The present invention relates generally to electrical probes for oscilloscopes and other measuring, monitoring and signal processing instruments. More particularly, the invention relates to an improved, modular form of probe construction.

Many types of electrical probes are used for detecting electrical signals, such as voltage, current or logic signals, and transmitting the detected signals to the input of an oscilloscope or other electrical instrument. Generally speaking, conventional probes include three main components: a signal input member known as a "head", a termination including a signal output connector, and a length of flexible transmission line, or cable, interconnecting the head and termination.

Probes receive a considerable amount of handling and may become damaged, either accidently or through operator misuse. The most frequent victim of inadvertent or negligent abuse is the cable, which suffers from kinking, stretching, and excessive flexing. However, probe heads and terminations also are frequently damaged, by being dropped, for example, or electrically overloaded. In any event, once a probe has been damaged, repair is inconvenient and time consuming since the cable typically is fixedly attached, as by soldering, welding or crimping, to both the head and termination. Disassembly, component replacement, and reassembly take considerable time, and the resulting labor costs may make it uneconomical to repair the probe.

There is clearly a need for an improved probe construction that permits damaged components to be replaced quickly and easily, and it is an object of the present invention to satisfy this need in a practical and satisfactory manner.

A more specific object of the invention is to provide an electrical probe constructed of releasably interconnected, standardized modules, permitting ready replacement of a damaged or worn-out module.

Another object of the invention is to provide a modular form of probe construction in which the different components are adapted to be plugged together for convenient assembly and disassembly.

In certain applications, it is desirable that different components of a probe not be too easily disconnected from one another. For example, it may be necessary or required for safety reasons that the output connector and cable of a probe be secure against inadvertent disassembly, where such would expose a user to dangerous electrical potentials. Accordingly, it is a further object of the invention to provide a releasable locking connector for joining components of an electrical probe.

Additional objects, features and advantages of the present invention will become apparent as the following description of certain preferred embodiments is read in conjunction with the accompanying drawings.

BRIEF DESCRIPTION OF THE DRAWINGS

FIG. 1 is a semi-perspective side view, partly broken away and partly in section, of a probe head for the modular probe system of the present invention;

FIG. 2 is a semi-persepective side view, partly broken away and partly in section, of a modular probe cable;

FIG. 3 is a side view, partly broken away and partly in section, of a modular probe termination comprising a compensation box and output connector;

FIG. 4 is an enlarged, fragmentary perspective view of one end of the termination shown in FIG. 3;

DESCRIPTION OF PREFERRED EMBODIMENTS

Figure 5:
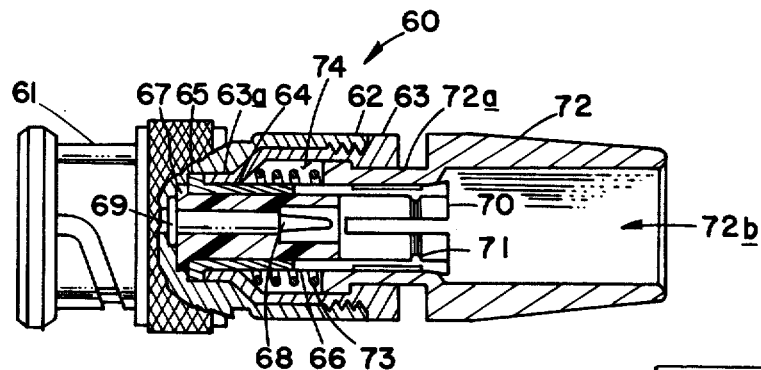
FIG. 5 is an enlarged side view, partly cut away and partly in section, of an alternative form of modular terminaton—a releasable locking output connector.

Turning now to the drawings, wherein like reference numerals indicate like elements throughout, a modular signal acquisition probe according to the present invention is shown in FIGS. 1–3. As will be understood, the illustrated probe is a general purpose passive voltage probe suitable for use with a cathode ray oscilloscope, and includes a signal sensing head 10, a cable assembly 20, and a termination 30.

Referring to FIG. 1, probe head 10 includes a generally tubular body 11 having an elongate forward portion, or nose, 12 joined to an elongate, generally cylindrical rearward portion, or handle, 13 by an outwardly extending flange 14. As will be appreciated, flange 14 serves as a finger stop and guard for handle 13. Body 11 is formed of a relatively rigid electrical insulating material, suitably an electrical grade plastic. A cylindrical metal sleeve 15 forming an outer conductor for the probe head is suitably secured in a central bore running the length of nose 12. One end of sleeve 15, the left end in the drawing, protrudes beyond the forward end of nose 12 to provide an exposed portion 15a. A metal probe tip 16 is coaxially supported within portion 15a by an insulating plug 17. The opposite end of the sleeve projects coaxially into the central region of a cylindrical bore 13a in handle 13, and is slotted to form a collet 18. An inwardly-extending circumferential rib 19 is provided in sleeve 15 intermediate the ends of the collet. Forward of collet 18, a metal contact pin 21 is coaxially supported in the sleeve by a cylindrical insulator 22. As will be understood, tip 16 and pin 21 comprise an inner conductor for probe head 10 and are electrically connected. In applications where no signal attenuation by the probe head is desired, the tip and pin may be end sections of a thin metal rod fixedly supported in sleeve 15 by suitable annular insulating members (not shown). Normally, however, tip 16 and pin 21 are connected to the opposite ends of a series dropping resistor (not shown) mounted within sleeve 15 in nose 12. A frequency compensation capacitor connected in parallel with the resistor also may be mounted in the nose of probe head 10.

Turning to FIG. 2, cable assembly 20 includes a length of flexible coaxial cable 23 of a known type provided with a connector plug 24 at one end and an identical plug 24' at the other. Although the two plugs may have different configurations, preferably they are identical, and hence functionally interchangeable. Cable 23 may be either a conventional constant impedance coaxial transmission line having a low resistance center conductor, or a resistive center conductor cable of the type described in U.S. Pat. No. 2,883,619 to Kobbe et al., depending on the intended use of the probe.

Plug 24 includes a pair of coaxially disposed tubular contact members, an inner contact 25 and an outer contact 26, which extend axially outward from the end of cable 23 and are connected in a suitable manner to the respective inner, or center, and outer or shield, conductors of the cable. Inner contact 25 extends outward the greater distance and is supported in contact 26 by an annular insulator 27 that may be the coaxial cable's dielectric 23a. Outer contact 26 is in turn supported in the plug by an integral annular member 28. Inner contact 25 is firmly held in contact 26 by a circular crimp in the cylindrical outer surface 26a of the outer contact; the crimp forming a circumferential groove 29 in the surface. A metal sleeve 31 crimped over the inner end of member 28 and an end portion of cable 23 anchors contacts 25, 26 to the cable. Plug 24 also includes an insulating cover 32 formed, as by molding, of a flexible plastic. Cover 32 includes a cylindrical forward section 32a, which functions as a handle for the plug, and a tapered rear section 33 that prevents excessive bending of the cable adjacent the plug. As will be understood, the above description of plug 24 is equally applicable to plug 24'.

Referring now to FIGS. 3 and 4, termination 30 includes an elongate box-like metal enclosure 34 having a base 35 and a cap 36. One end of enclosure 34, the right end in the drawings, is provided with an outwardly projecting cylindrical tube 37 having a central bore 38 communicating with the interior of the enclosure. Tube 37 is flanked by an opposed pair of externally threaded shoulders 39,40 of increased diameter that extend about midway the length of the tube. In the illustrated embodiment, tube 37 and shoulders 39,40 are formed integrally, as by casting, with base 35. A pair of transverse slots 41, 42 opening into bore 38 are provided in tube 37 about midway between shoulders 39,40 respectively, and the outer end of the tube. Urged into slots 41,42 are the respective bottom sections of two box U-shaped wire springs 43,44. As shown in FIG. 4, spring 43 is retained on tube 37 by a pair of ears 45 that protrude laterally from shoulder 39 and bear against the sides of the spring, and two T-shaped projections 47 (one shown) at the base of the tube that capture the spring's tips. Spring 44 is retained in a similar manner by ears 46 and projections 47.

Referring to FIG. 3, a metal contact pin 48 is supported in bore 38 by an annular insulator 49. The inner end of the pin extends into enclosure 34 and is connected to the input of an RC network contained in the enclosure. A tapered insulating sleeve 50, suitably formed of rigid plastic and having an internally threaded end 50a. is screwed onto shoulders 39, 40 and seated against the end of the enclosure. Thus seated, sleeve end 50a captures a protruding semicircular lip 51 (FIG. 4) on cap 36 to hold the cap on base 35. A portion 50b of the sleeve extending outward past the free end of tube 37 includes a cylindrical bore 52 that is axially aligned with tube bore 38.

A conventional BNC-series connector 53 is mounted at the opposite (i.e., the left) end of enclosure 34. Skirt portion 53a of the connector is threaded onto a boss (not shown) on base 35, and captures a lip similar to lip 51 at the opposite end of the cap to hold the cap on the base. The center conductor of connector 53 is connected to the output of the previously-mentioned RC network in enclosure 34.

Assembly of the modular probe is simple and straightforward: cable plug 24 is linearly inserted into bore 13a in the handle of head 10 and plug 24' is likewise inserted into bore 52 in the sleeve of termination 30. Upon such insertion, outer contact 26 of plug 24 enters collet 18 and surface 26a is gripped by the collet, with rib 19 engaging groove 29 to provide a secure detented connection. At the same time, pin 21 enters the open end of inner contact 25 and frictionally engages its inner wall. Preferably, the end of pin 21 is tapered slightly or rounded and the open end of contact 25 is flared as shown to facilitate mating of the two parts. In a similar manner, outer contact 26' of plug 24' enters tube 37 and is gripped by springs 43, 44, which engage groove 29', and pin 48 enters and engages the inner wall of contact 25'. The probe tip 16 and sleeve portion 15a, which serves as a signal reference or ground contact in head 11, are thus electrically connected to the center contact and sleeve, respectively, of output connector 53.

To replace one of the probe's modular components, the head for example, it is merely necessary to pull cable plug 24 straight out of handle 13 and insert it in a replacement head of the same type. The same is true if one of the other components must be replaced. As will be understood, bore 13a, collet 18 and pin 21 together form a jack in head 10 that is sized to receive cable plug 24 and provide a snug, secure fit. An equivalent jack is formed in termination 30 by bore 52, tube 37 and pin 48.

In some instances, it is necessary or desirable that a cable plug not be too easily removable from the jack in which it has been inserted. For example, if the tip of a nonattenuating (1X) probe is in contact with a high voltage point in an electrical circuit and the probe cable's plug is, perhaps accidentally, pulled out of the termination jack, the high voltage present on the plug's center contact creates a harzard. Thus, referring to FIGS. 5 and 6, an alternative form of termination—a releasable locking connector—is indicated at 60. Connector 60 includes a conventional BNC-series connector body 61 having an internally threaded cylindrical skirt 62. Screwed into skirt 62 is a closely fitting bushing 63 having a reduced diameter inner end portion 63a. A generally cylindrical tubular member 64, suitably formed of a conductive spring metal alloy, such as phosphor bronze or beryllium copper, supported by an elongate tubular insulator 66 on a central contact pin 68, is partly received within portion 63a of the bushing, as shown. The inner end of the bushing bears against an external flange 65 on the inner end of member 64, forcing it against a similar flange 67 on insulator 66, which is prevented from moving by a flanged projection 69 at the base of pin 68.

The outer end porton of conductive member 64 is axially slotted to form a collet 70, which is provided with a circumferentially-extending internal rib 71. Slideably received on member 64 is the reduced diameter portion 72a of a shaped sleeve 72 having a cylindrical axial bore 72b. A compression spring 73 disposed in an annular chamber 74 between member 64 and bushing 63 acts against the sleeve's inner end, biasing sleeve 72 rearward (i.e., to the right in the figures). Movement in that direction is limited by contact between an external flange 72c at the inner end of the sleeve and a step 75 adjacent the outer end of bushing 63.

Figure 6:
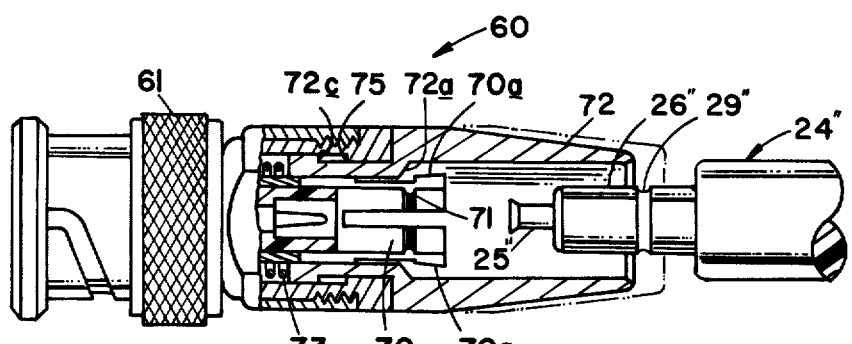
FIG. 6 is a similar view illustrating operation of the modular output connector shown in FIG. 5.

As best shown in FIG. 6, the rearward or outer end of collet 70 is flared slightly, suitably about 3°-5°, providing inwardly tapered exterior surface regions 70a adjacent the outer end of member 64. With sleeve 72 in the position shown in FIG. 5, indicated in phantom outline in FIG. 6, its reduced diameter portion 72a bears against regions 70a, and acts to close collet 70. Sliding sleeve 72 forward, i.e., to the left, to the position shown in FIG. 6 allows the collet to open.

To attach connector 60 to a cable plug 24", sleeve 72 is pushed forward, compressing spring 73 and allowing collet 70 to open. The plug is then inserted into bore 72b of the sleeve, with outer plug contact 26" entering collet 70 and inner contact 25" sliding onto contact pin 68. Upon its release, sleeve 72 is forced toward the rear by spring 73, against the tapered surface regions 70a on the collet. The resulting pressure causes collet to close, firmly gripping contact 26" and pressing rib 71 into groove 29". The cable plug is thereby locked to connector 60 and cannot be pulled out without first moving the sleeve forward to open collet 70. In practice, a spring rate of about 6–10 lbs./in. for spring 73, with a preload of about 2 lbs. in the locked position, has proved to be satisfactory. Connectors having such springs typically withstand an axial withdrawal force of 35 lbs. or more.

Figure 7:
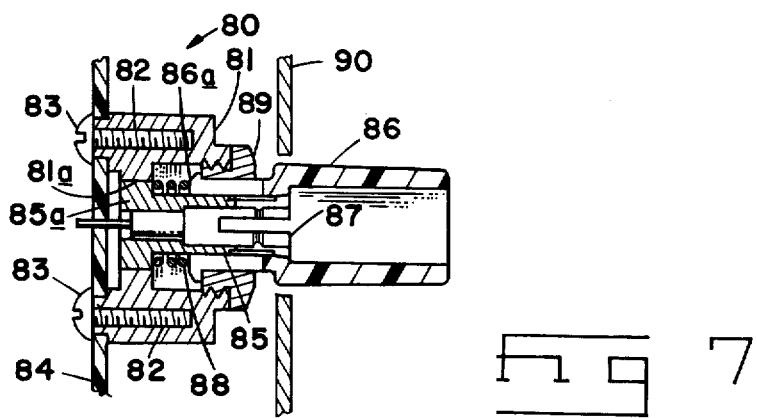
FIG. 7 is a cross sectional side view of another alternative form of modular termination—a releasable locking panel mount connector.

Another alternative form of modular probe system termination is shown in FIG. 7—a panel mount version of the locking connector. Thus, termination, or connector, 80 includes a metal body 81 having plural bores 82 receiving screws 83 that secure the body to a panel 84, herein a fiberglass-reinforced plastic panel. The enlarged inner end 85a of a generally cylindrical conductive spring metal member 85 is secured, as by pressing, in a matching bore 81a in the connector body. A sleeve 86, suitably formed of rigid plastic, is slideably received on member 85, which includes a collet 87. A compression spring 88 disposed in an annular space between member 85 and body 81 acts against the inner end of sleeve 86, biasing it to the right in the drawing. Movement of the sleeve is limited by contact between an external flange 86a on the sleeve and the inner end of a bushing 87 threaded into body 81. A center contact pin is supported in member 85 by a tubular insulator, and extends to the left in the drawing through a suitable aperature in panel 84, as shown.

As will be appreciated, connector 80 functions in the same manner as previously described connector 60. Such a panel mount connector may be secured to an insulating subpanel in an electrical instrument with only sleeve 86 protruding from the instument's front panel, i.e., panel 90 in FIG. 7. All of the connector's metal parts are thus inaccessible to an operator, allowing the instrument's input to be "floated" if required without subjecting the operator to any hazard.

There is thus provided a modular probe system which amply fulfills the various objectives set forth above. While several preferred embodiments of the invention have been described, it will be appreciated that various modifications and changes may be made within the scope of the invention as claimed. For example, the probe head and termination in a system may be provided with nonlocking jacks of the types shown in FIGS. 1 and 3, or with releasable locking jacks of the type shown in FIGS. 5 and 7 or mixtures of the different types. Other variations will be apparent to those skilled in the art.

We claim:

1. A modular signal acquisition probe for an electrical instrument, comprising
    a probe head including input means for coupling said probe to a circuit under test, and output means comprising a jack for receiving and releasably retaining a mating plug therein,
    a temination for coupling a signal acquired by said probe head to an input connector for said instrument, said termination including input means comprising a jack for receiving and releasably retaining a mating plug therein, and output means comprising an electrical connector configured to mate with said instrument's input connector, and
    an elongate signal transmission line provided at one end with a plug configured to mate with said probe head jack and at its other end with a plug configured to mate with said termination jack.

2. The probe of claim 1, wherein said transmission line plugs are substantially identical in configuration.

3. The probe of claim 1, wherein said termination jack includes releasable locking means for preventing withdrawal of the mating plug after its insertion in said jack.

4. In a modular probe comprising a probe cable assembly that includes a multiconductor cable having a connector plug at one end, said plug having a pair of generally cylindrical, coaxially disposed contact surfaces, and a termination for coupling said assembly to an input terminal of an electrical instrument, said termination comprising
    intermediate connector means for releasably connecting said termination to said instrument input terminal, and
    a jack receiving and releasably retaining said cable plug, said jack having a pair of generally cylindrical, coaxially disposed contact surfaces configured to engage those of said plug upon its linear insertion into said jack, and means for gripping at least one of said plug contact surfaces to impede removal of the plug from the jack.

5. The probe termination of claim 4, wherein said jack includes releasable locking means for preventing removal of said plug after its insertion into said jack.

6. An electrical probe assembly consisting of individually interchangeable, releasably interconnectable modular components, including
    a probe head having input means for coupling to an electrical circuit under test, and output means comprising a connector jack for receiving and frictionally retaining a mating connector plug,
    a termination for coupling a signal acquired by said probe head to an input connector of an electrical instrument, said termination including input means comprising a connector jack for receiving and frictionally retaining a mating connector plug, and output means comprising an electrical connector configured to mate with said instrument input connector, and
    an elongate signal transmission line provided at one end with a connector plug configured to mate with said probe head jack and at the other end with a connector plug configured to mate with said termination jack.

7. The assembly of claim 6, wherein said transmission line plugs are substantially identical, each including a pair of generally cylindrical, coaxially disposed contact surfaces, and said jacks each include a pair of coaxially disposed contact surfaces configured to engage the respective ones of a mating plug upon its linear insertion into a jack, and means for gripping at least one of said plug contact surfaces to impede removal of the plug from the jack.

* * * * *